(12) United States Patent
Bickford et al.

(10) Patent No.: US 9,791,502 B2
(45) Date of Patent: Oct. 17, 2017

(54) ON-CHIP USABLE LIFE DEPLETION METER AND ASSOCIATED METHOD

(71) Applicant: International Business Machines Corporation, Armonk, NY (US)

(72) Inventors: Jeanne P. Bickford, Essex Junction, VT (US); Nazmul Habib, South Burlington, VT (US); Baozhen Li, South Burlington, VT (US); Tad J. Wilder, South Hero, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 246 days.

(21) Appl. No.: 14/700,402

(22) Filed: Apr. 30, 2015

(65) Prior Publication Data

US 2016/0320214 A1     Nov. 3, 2016

(51) Int. Cl.
*G01R 31/28*     (2006.01)
*G11C 17/16*     (2006.01)
(Continued)

(52) U.S. Cl.
CPC ............ *G01R 31/2884* (2013.01); *G11C 7/04* (2013.01); *G11C 16/349* (2013.01); *G11C 17/16* (2013.01); *G11C 17/18* (2013.01)

(58) Field of Classification Search
CPC ............. G06F 11/004; G06F 11/3065; G06F 11/3058; G06F 11/30; G06F 9/44505;
(Continued)

(56) References Cited

U.S. PATENT DOCUMENTS 5,768,290 A * 6/1998 Akamatsu ............... G11C 29/02
                                                                            257/E23.179
5,986,320 A * 11/1999 Kawano ................. G11C 29/44
                                                                              257/209
(Continued)

FOREIGN PATENT DOCUMENTS

CN           103514958 A      1/2014
EP            0430844 A3       6/1991
(Continued)

OTHER PUBLICATIONS

Disclosed Anonymously, "Method to Detect Unauthorized Reuse or Counterfeiting of Semiconductor Components" www.ip.com, IPCOM000239170, Oct. 19, 2014, pp. 1-3.

(Continued)

*Primary Examiner* — Guerrier Merant
(74) *Attorney, Agent, or Firm* — Gibb & Riley, LLC; David A. Cain, Esq.

(57) ABSTRACT

Disclosed is an integrated circuit (IC) chip having an on-chip usable life depletion meter. This meter incorporates programmable bits, which represent units of usable life. These programmable bits are sequentially ordered from an initial programmable bit to a last programmable bit and are automatically programmed in order, as the expected usable life of the IC chip is depleted. These programmable bits are readable to determine the remaining usable life of the IC chip. Also disclosed is a method that uses the on-chip usable life depletion meter. In the method, the remaining usable life of an IC chip, once known, is used either as the basis for allowing re-use of the IC chip (e.g., for a non-critical application and when the remaining usable life is sufficient) or as the basis for preventing re-use of the IC chip (e.g., for a critical application or when the remaining usable life is insufficient).

16 Claims, 6 Drawing Sheets

(51) Int. Cl.
*G11C 17/18* (2006.01)
*G11C 7/04* (2006.01)
*G11C 16/34* (2006.01)

(58) Field of Classification Search
CPC ......... G06F 11/008; G11C 5/147; G11C 7/04; G11C 16/349; G11C 17/18; G11C 17/16; G05F 3/24; G01R 31/2884
See application file for complete search history.

(56) References Cited

U.S. PATENT DOCUMENTS

| | | | |
|---|---|---|---|
| 6,034,903 A * | 3/2000 | Ichikawa | G11C 29/785 365/200 |
| 8,151,094 B2 | 4/2012 | Vera et al. | |
| 8,479,261 B2 | 7/2013 | Byers et al. | |
| 8,549,363 B2 | 10/2013 | Cher et al. | |
| 9,269,407 B1 * | 2/2016 | Bickford | G11C 5/147 |
| 2003/0078741 A1 * | 4/2003 | Storino | G06Q 30/02 702/34 |
| 2005/0023656 A1 * | 2/2005 | Leedy | B81B 7/02 257/678 |
| 2005/0047224 A1 * | 3/2005 | Farnsworth, III | G01R 31/318558 365/200 |
| 2012/0112881 A1 | 5/2012 | Eluard et al. | |
| 2013/0073257 A1 * | 3/2013 | Williams | G01R 31/3274 702/179 |
| 2014/0022008 A1 | 1/2014 | Noorlag et al. | |
| 2014/0088947 A1 | 3/2014 | Anemikos et al. | |
| 2014/0197895 A1 | 7/2014 | Chen et al. | |
| 2014/0355040 A1 | 12/2014 | Liu | |
| 2015/0033081 A1 * | 1/2015 | Bickford | G06F 11/004 714/39 |

FOREIGN PATENT DOCUMENTS

| | | |
|---|---|---|
| JP | 2005-128991 A | 5/2005 |
| JP | 2006-254574 A | 9/2006 |
| WO | 02069281 A3 | 9/2002 |
| WO | 2006064921 A3 | 6/2006 |

OTHER PUBLICATIONS

U.S. Appl. No. 14/620,273, filed Feb. 12, 2015, 36 pages.

* cited by examiner

ON-CHIP USABLE LIFE DEPLETION METER AND ASSOCIATED METHOD

BACKGROUND

The present disclosure relates to re-use of integrated circuit (IC) chips and, more particularly, to an IC chip structure having an on-chip usable life depletion meter and an associated method that uses this on-chip usable life depletion meter to promote re-use of the IC chip, when desirable, and prevent re-use, when undesirable.

More particularly, oftentimes previously used integrated circuit (IC) chips (i.e., recycled IC chips) are accidently or surreptitiously incorporated into products, either initially or during printed circuit board (PCB) rework (e.g., when a faulty IC chip on a printed circuit board (PCB) within a product is removed for repair or replacement). Such used IC chips create functionality and reliability issues because there is no way of tracking whether the used IC chip has exceeded its expected usable life. This is of particular concern when the product into which the used IC chip is incorporated is a critical product (i.e., a product with a life or mission critical function, such as a medical or military function). Current schemes rely on strict access control over IC chip supply and are not always effective.

SUMMARY

In view of the foregoing, disclosed herein are embodiments of an integrated circuit (IC) chip having an on-chip usable life depletion meter. This usable life depletion meter can comprise multiple programmable bits, which represent units of usable life. These programmable bits can be sequentially ordered from an initial programmable bit to a last programmable bit and can be automatically programmed in order, as the expected usable life of the IC chip is depleted. These programmable bits can be readable to determine the remaining usable life of the IC chip. Also disclosed herein are embodiments of a method that uses such an on-chip usable life depletion meter. In embodiments of the method, the remaining usable life of an IC chip, once known, can be used either as the basis for allowing re-use of the IC chip, when desirable (e.g., in the case of a non-critical product and when the remaining usable life is sufficient), or as the basis for preventing re-use of the IC chip, when undesirable (e.g., in the case of a critical product or when the remaining usable life is insufficient).

More particularly, disclosed herein are embodiments of an integrated circuit (IC) chip. The IC chip can comprise a substrate and a usable life depletion meter on the substrate. The usable life depletion meter can comprise multiple first programmable bits and, particularly, one-time programmable bits (e.g., fuses, anti-fuses or any other suitable one-time programmable bits). The first programmable bits can represent units of usable life of the IC chip and can be sequentially ordered from an initial programmable bit, which corresponds to the beginning of the usable life of the IC chip, to a last programmable bit, which corresponds to the end of the usable life of the IC chip.

During operation of the IC chip, the first programmable bits can be automatically programmed in order starting with the initial programmable bit as the expected usable life of the IC chip is depleted.

For example, each unit of usable life represented by each first programmable bit in the usable life depletion meter can correspond to a specific number x of power-on hours (POHs). In operation, whenever it is noted that the actual power-on hours as measured by a power-on hours monitor have increased by that specific number x of POHs, the next programmable bit in order in the usable life depletion meter can be programmed.

Alternatively, each unit of usable life represented by each first programmable bit in the usable life depletion meter can correspond to a specific number x of POHs at a nominal operating voltage and/or a nominal operating temperature. In operation, whenever it is noted that the actual power-on hours as measured by a power-on hours monitor have increased by an amount equivalent to the specific number x of POH at the nominal operating voltage and the nominal operating temperature considering any difference between the actual operating voltage as indicated by a voltage monitor and the nominal operating voltage and/or considering any difference between the actual operating temperature as indicated by a temperature monitor and the nominal operating temperature, the next programmable bit in order in the usable life depletion meter can be programmed.

In any case, these first programmable bits can be readable to determine the remaining usable life of the IC chip.

Also disclosed herein are embodiments of a method of using the above-described on-chip usable life depletion meter. Specifically, the embodiments of the method can comprise mounting an integrated circuit (IC) chip onto a printed circuit board (PCB). This IC chip can, as described above, comprise a substrate and a usable life depletion meter on the substrate. The usable life depletion meter can comprise multiple first programmable bits and, particularly, one-time programmable bits (e.g., fuses, anti-fuses or any other suitable one-time programmable bits). The first programmable bits can represent units of usable life of the IC chip and can be sequentially ordered from an initial programmable bit, which corresponds to the beginning of the usable life of the IC chip, to a last programmable bit, which corresponds to the end of the usable life of the IC chip. The embodiments of the method can further comprise, during operation of the IC chip, automatically programming the first programmable bits in order starting with the initial programmable bit as the expected usable life of the IC chip is depleted.

Specifically, in one embodiment of the method, each unit of usable life represented by each first programmable bit in the usable life depletion meter can correspond to a specific number x of power-on hours (POHs). In this case, the process of programming the first programmable bits can comprise: noting whenever the actual power-on hours as measured by a power-on hours monitor have increased by that specific number x of POHs; and, in response, programming the next programmable bit in order in the usable life depletion meter.

In another embodiment of the method, each unit of usable life represented by each first programmable bit in the usable life depletion meter can correspond to a specific number x of power-on hours (POHs) at a nominal operating voltage and/or a nominal operating temperature. In this case, the process of programming the first programmable bits can comprise: noting whenever the actual power-on hours as measured by a power-on hours monitor have increased by an amount equivalent to the specific number x of POHs at the nominal operating voltage and the nominal operating temperature considering any difference between the actual operating voltage as indicated by a voltage monitor and the nominal operating voltage and/or considering any difference between the actual operating temperature as indicated by a temperature monitor and the nominal operating temperature;

and, in response, programming the next programmable bit in order in the usable life depletion meter.

In any case, such programmable bits can be read, for example, when the IC chip is mounted on a printed circuit board in order to determine whether that IC chip has been previously mounted on a different printed circuit board and, if so, to further determine the remaining usable life of an IC chip. The remaining usable life of the IC, once known, can be used either as the basis for allowing re-use of the IC chip, when desirable (e.g., in the case of a non-critical product and when the remaining usable life is sufficient), or as the basis for preventing re-use of the IC chip, when undesirable (e.g., in the case of a critical product or when the remaining usable life is insufficient).

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, oftentimes previously used integrated circuit (IC) chips (i.e., recycled IC chips) are accidently or surreptitiously incorporated into products, either initially or during printed circuit board (PCB) rework (e.g., when a faulty IC chip on a printed circuit board (PCB) within a product is removed for repair or replacement). Such used IC chips create functionality and reliability issues because there is no way of tracking whether the used IC chip has exceeded its expected usable life. This is of particular concern when the product into which the used IC chip is incorporated is a critical product (i.e., a product with a life or mission critical function, such as a medical or military function). Current schemes rely on strict access control over IC chip supply and are not always effective.

In view of the foregoing, disclosed herein are embodiments of an integrated circuit (IC) chip having an on-chip usable life depletion meter. This usable life depletion meter can comprise multiple programmable bits, which represent units of usable life. These programmable bits can be sequentially ordered from an initial programmable bit to a last programmable bit and can be automatically programmed in order, as the expected usable life of the IC chip is depleted. These programmable bits can be readable to determine the remaining usable life of the IC chip. Also disclosed herein are embodiments of a method that uses such an on-chip usable life depletion meter. In embodiments of the method, the remaining usable life of an IC chip, once known, can be used either as the basis for allowing re-use of the IC chip, when desirable (e.g., in the case of a non-critical product and when the remaining usable life is sufficient), or as the basis for preventing re-use of the IC chip, when undesirable (e.g., in the case of a critical product or when the remaining usable life is insufficient).

Figure 1:
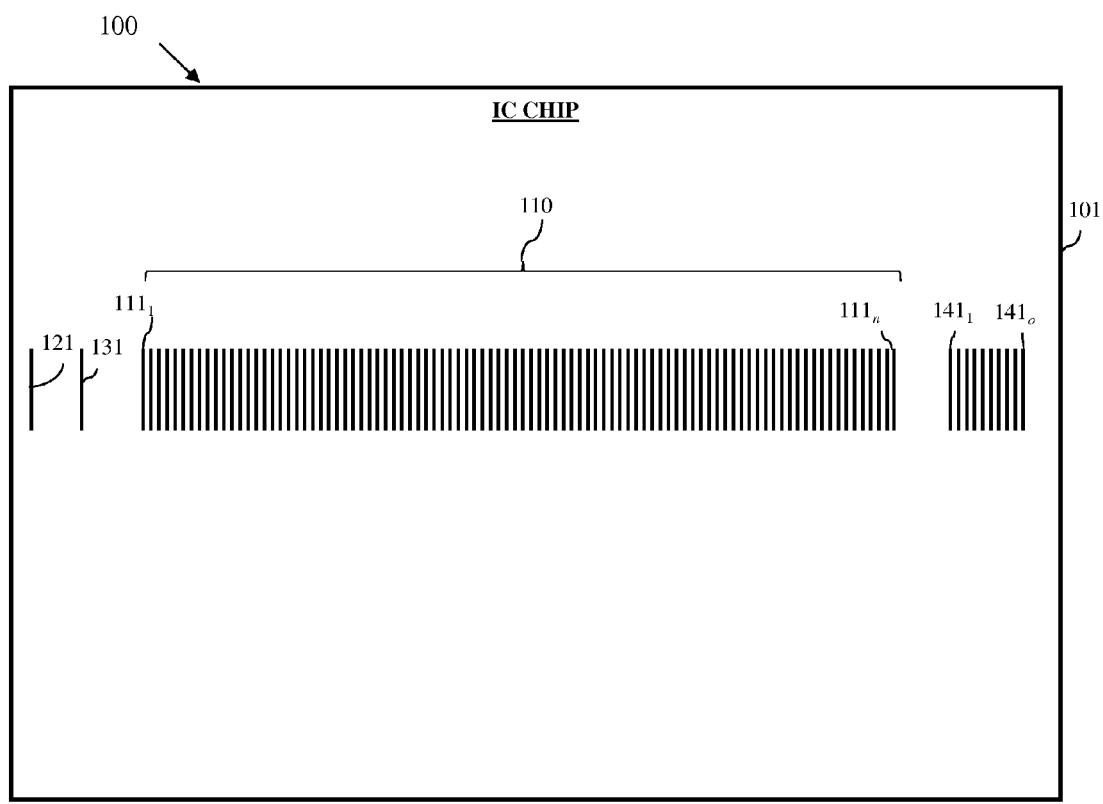
FIG. 1 is a schematic diagram illustrating an integrated circuit (IC) chip with multiple programmable bits including programmable bits of an on-chip usable life depletion meter.

More particularly, referring to FIG. 1, disclosed herein are embodiments of an integrated circuit (IC) chip 100. The IC chip 100 can comprise a substrate 101 and a usable life depletion meter 110 on the substrate 101. The usable life depletion meter 110 can comprise multiple first programmable bits $111_1$-$111_n$ (also referred to herein as usable life bits). The integrated circuit chip 100 can further comprise a second programmable bit 121 (also referred to herein as "a printed circuit board (PCB) mounted bit") on the substrate 101. Optionally, the IC chip 100 can further comprise a third programmable bit 131 (also referred to herein as a "do not use bit") and multiple fourth programmable bits $141_1$-$141_o$ (also referred to herein as "recycler identifier bits") on the substrate 101. All of the above-described programmable bits (i.e., the first programmable bits $111_1$-$111_n$, the second programmable bit 121, the third programmable bit 131 and the fourth programmable bits $141_1$-$141_o$) can specifically comprise one-time programmable bits. One-time programmable bits refer to devices that, once programmed (i.e., once written to), cannot be re-programmed. Exemplary one-time programmable bits include, but are not limited to, fuses, anti-fuses or any other suitable one-time programmable bits. Those skilled in the art will recognize that in the case of a fuse such one-time programming involves blowing the fuse (i.e., breaking the electrical connection in the fuse), thereby changing the value of the fuse, when read, from a first value (e.g., a high or "1" value) to a second value (e.g., a low or "0" value). Contrarily, in the case of an anti-fuse such on-time programming involves breaking down dielectric material in the anti-fuse to establish an electrical connection, thereby changing the value of the anti-fuse, when read, from a first value (e.g., a low or "0" value) to a second value (e.g., a high or "1" value).

FIGS. 2A-2F illustrate exemplary states of programming of the programmable bits 121, 131, $111_1$-$111_n$ and $141_1$-$141_o$ over the course of the usable life the IC chip 100. For purposes of illustration, the programmable bits 121, 131, $111_1$-$111_n$ and $141_1$-$141_o$ are shown in as fuses with solid lines representing fuses that have not yet been programmed (i.e., that have not yet been blown) and broken lines representing fuses that have been programmed (i.e., that have been blown). It should, however, be understood that these FIGS. 2A-2F are not intended to be limiting and that, as discussed above, the programmable bits 121, 131, $111_1$-$111_n$ and $141_1$-$141_o$ could alternatively be anti-fuses or any other suitable one-time programmable bits.

Figure 2A:
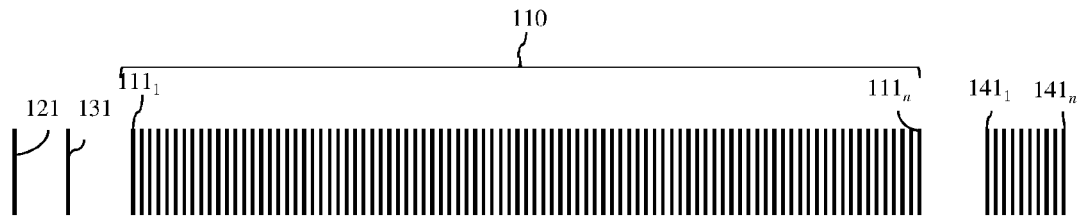
FIGS. 2A-2F illustrate exemplary states of programming of the programmable bits on the IC chip of FIG. 1.
Figure 2B:

Referring to FIGS. 2A and 2B, the second programmable bit 121 can be unprogrammed to indicate, when read, that the IC chip 100 has never been mounted on any printed circuit board (PCB) (see FIG. 2A) or programmed to indicate, when read, that the IC chip 100 has been mounted on a PCB (see FIG. 2B). Specifically, when the IC chip 100 is manufactured and before it is mounted onto a printed circuit board (PCB) for the first time, it will be unprogrammed (see FIG. 2A). Thus, if/when the second programmable bit is read prior to mounting on a PCB or immediately upon mounting on a PCB for the first time, it will indicate that the IC chip 100 has up until that time not been mounted on any PCB. The second programmable bit 121 can, following mounting on a PCB, be programmed (see FIG. 2B). Thus, if/when it is read after being removed from one PCB and mounted on another PCB, it will indicate that the IC chip has been previously mounted on a different PCB (i.e., has been previously recycled).

Figure 2C:
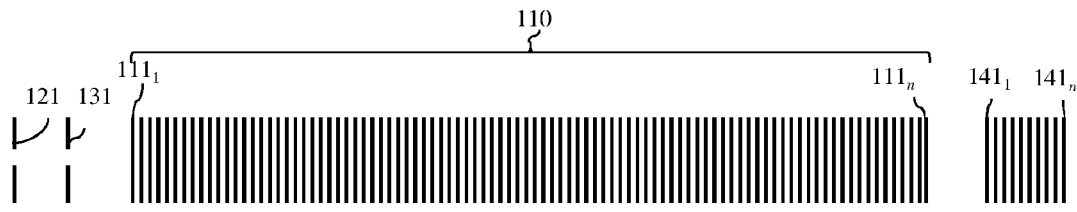

Referring to FIGS. 2A-2C, the optional third programmable bit 131 can either be unprogrammed to indicate, when read, that the IC chip 100 has passed testing (e.g., see FIGS. 2A-2B) or programmed to indicate, when read, that the IC chip 100 has previously failed during testing (see FIG. 2C). Specifically, before the IC chip 100 is tested for the first time and until such time as the IC chip 100 has failed, during testing, to meet an absolute performance threshold for use, the third programmable bit 131 will be unprogrammed. However, if the IC chip 100 ever fails to meet the absolute performance threshold for use, the third programmable bit 131 will be programmed (see FIG. 2C). Thus, prior to mounting the IC chip 100 on a PCB or immediately upon mounting the IC chip 100 on a PCB, the third programmable bit 131 can be read and a determination can be made to keep the IC chip 100 (e.g., if the third programmable bit 131 indicates that the IC chip 100 has never failed, during testing, to meet the absolute performance threshold for use) or to scrap the IC chip (e.g., if the third programmable bit indicates that the IC chip 100 has previously failed, during testing, to meet the absolute performance threshold for use). It should be understood that testing and, if necessary, programming of the third programmable bit 131 can be performed prior to mounting the IC chip 100 on a PCB, prior to incorporation of the PCB into a product or after incorporation of the PCB in the product. It should also be understood that the absolute performance threshold for use can apply to all IC chips having a specific design. This absolute performance threshold can further be established in order to scrap any IC chips that were manufactured according to the specific design, but due, for example, to defects or process variation perform at a level that would be considered unsuitable for use in essentially all applications (e.g., 95% of applications, 99% of applications, etc.). This absolute performance threshold for use can further be established in order to allow for possible use of any IC chips that were manufactured according to the specific design and that perform at a level suitable for use in some or all applications. It should also be understood that other performance criteria (e.g., product-specific performance criteria for IC chips) can be established to prevent use of a given IC chip in a given product even though that IC chip met the absolute performance threshold. For example, an IC chip that is only marginal in testing may still meet the absolute performance threshold such that it is not automatically scrapped, but may ultimately fail to meet some product-level performance criteria so that it cannot be incorporated into a given product.

Figure 2D:
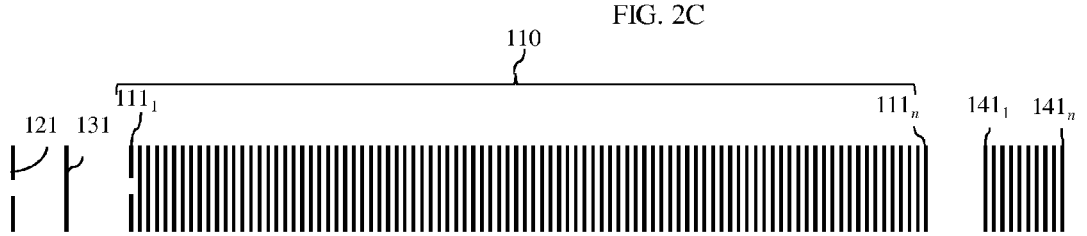
Figure 2E:
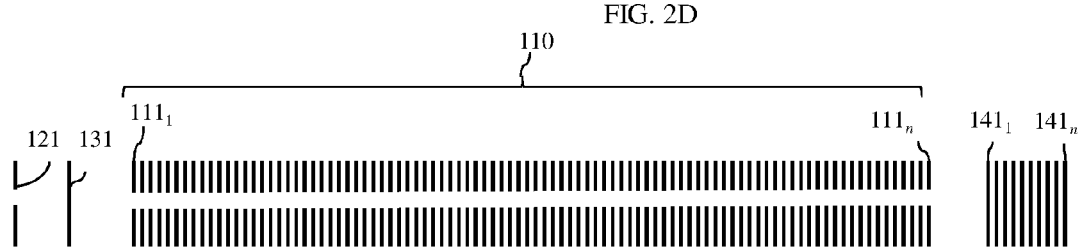

Referring to FIGS. 2D and 2E, the first programmable bits $111_1$-$111_n$ can represent units of usable life of the IC chip 100. These first programmable bits can be sequentially ordered from an initial programmable bit $111_1$, which corresponds to the beginning of the usable life of the IC chip, to a last programmable bit $111_n$, which corresponds to the end of the usable life of the IC chip. During operation of the IC chip 100, the first programmable bits can be automatically programmed in order over the course of the usable life of the IC chip 100. Specifically, the first programmable bits $111_1$-$111_n$ can be automatically programmed one at a time as the expected usable life of the IC chip 100 is depleted, starting with the initial programmable bit $111_1$ (see FIG. 2D) and ending with the last programmable bit $111_n$ when the expected usable life of the IC chip 100 is fully depleted (i.e., when the expected usable life if the IC chip 100 has passed) (see FIG. 2E). For purposes of this disclosure, the expected usable life of the IC chip 100 (also referred to in the art as the expected useful life of the IC chip 100) refers to the expected minimum amount of time or, more particularly, the expected minimum number of power-on hours (POHs) during which the IC chip is expected, with a specified probability, to perform without fail.

Figure 2F:
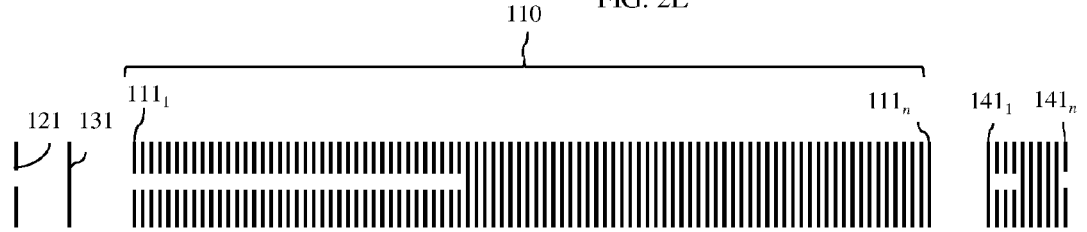

Referring to FIG. 2F, if prior to the end of the expected usable life of the IC chip, the IC chip 100 is removed from one PCB and mounted on another PCB, the optional fourth programmable bits $141_1$-$141_n$ can be used to provide information about the recycler responsible for recycling the IC chip 100. That is, the optional fourth programmable bits $141_1$-$141_n$ can either be unprogrammed (e.g., if the IC chip 100 has never been recycled) or programmed (see FIG. 2F) to indicate, when read, identification information associated with the recycler responsible for recycling the IC chip 100 (e.g., responsible for removing the IC chip 100 from a printed circuit board). The identification information can include, but is not limited to, an organization name, an organization identification number, a certification number and/or any other suitable identification information. Specifically, once an IC chip 100 has been used on a PCB in a product and subsequently removed from the PCB and product, identification information regarding the recycler responsible for removing and recycling the IC chip from the PCB can be programmed into fourth programmable bits $141_1$-$141_n$, if present, for subsequent use by a manufacturer attempting to mount the IC chip 100 on a new PCB and incorporate it into a new product.

Figure 3:
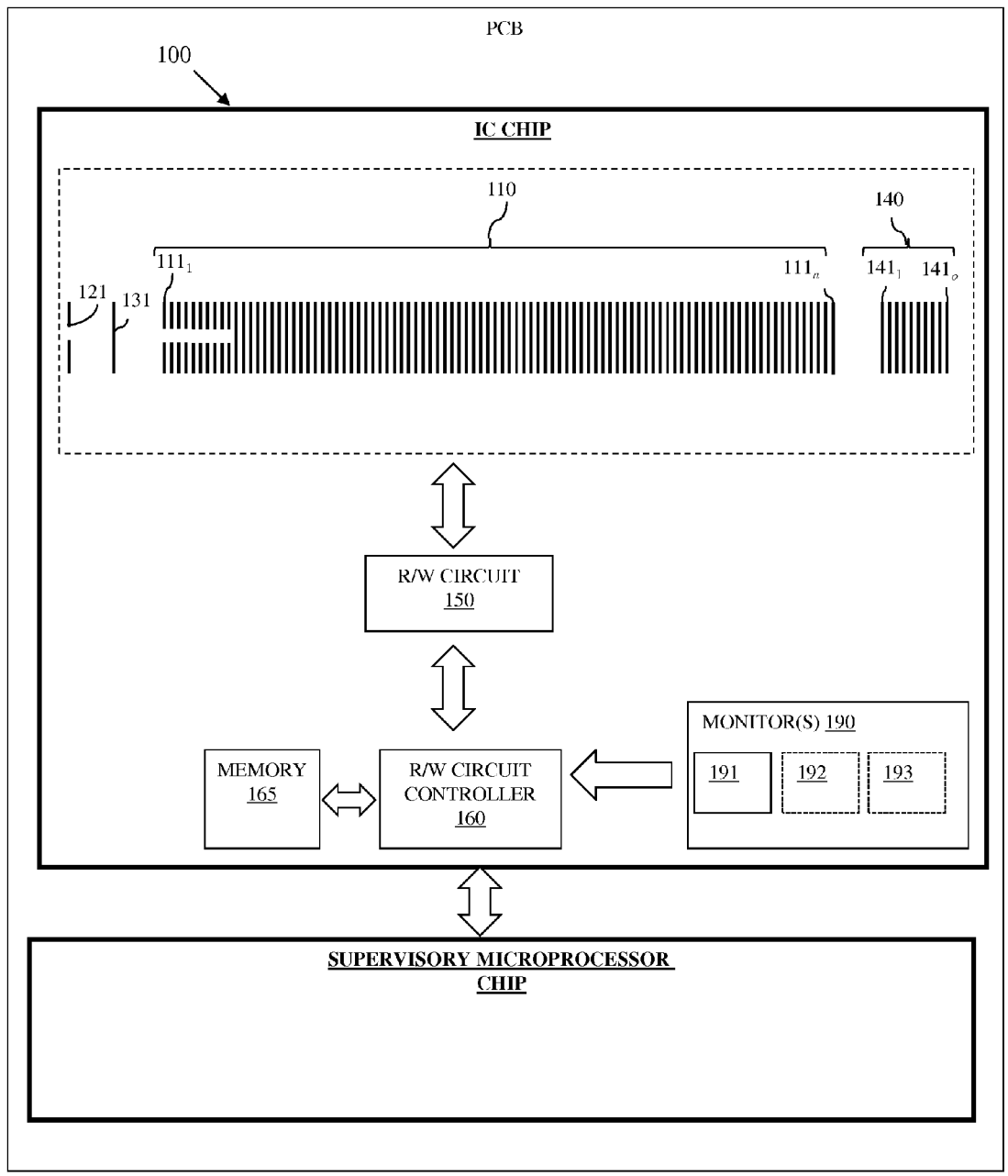
FIG. 3 is a schematic diagram illustrating an exemplary printed circuit board (PCB) with an IC chip, such as the IC chip of FIG. 1, mounted thereon and with additional on-chip and/or off-chip components required for programming and reading of the programmable bits.
Figure 4:
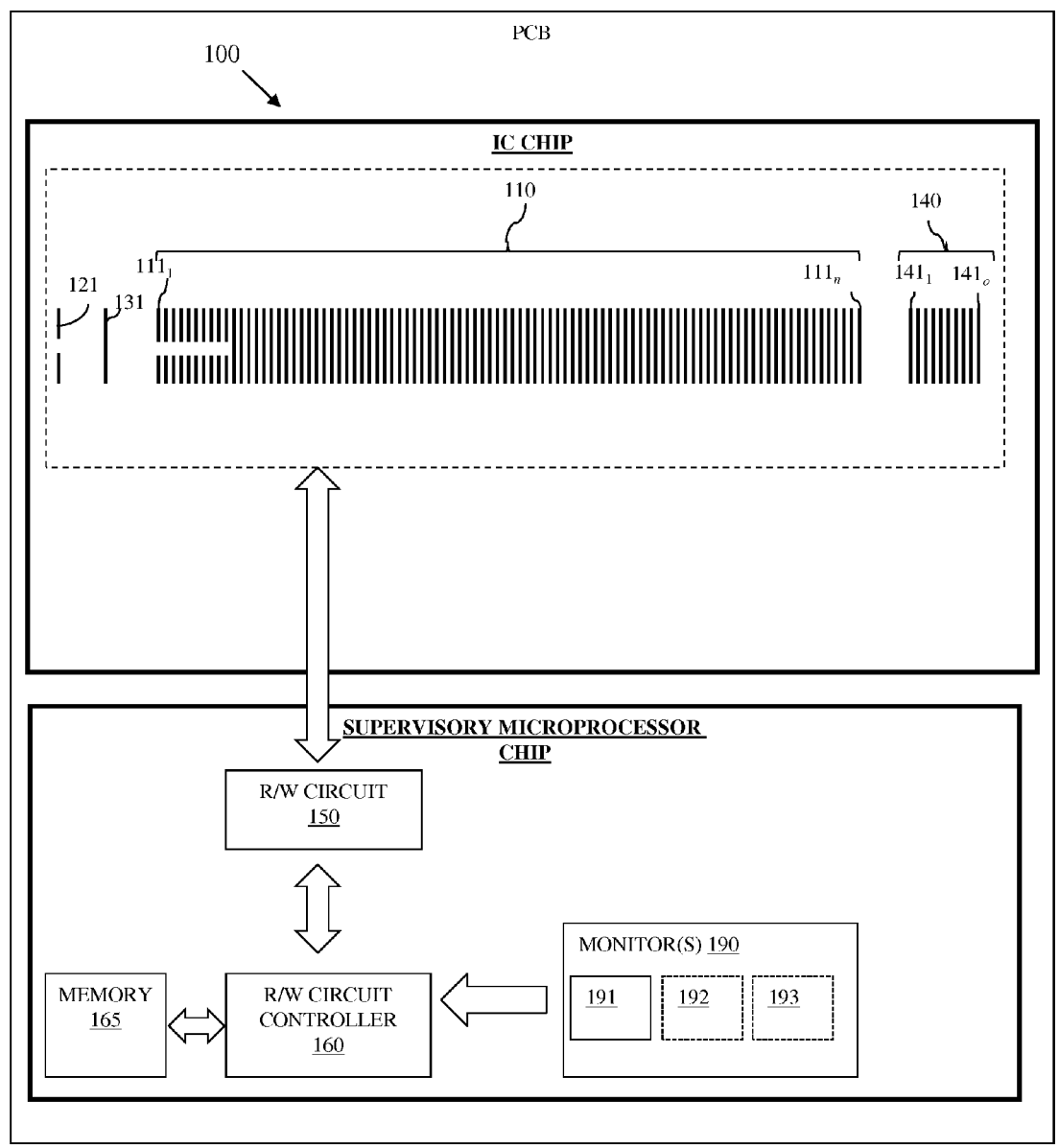
FIG. 4 is a schematic diagram illustrating another exemplary printed circuit board (PCB) with an IC chip, such as the IC chip of FIG. 1, mounted thereon and with additional on-chip and/or off-chip components required for programming and reading of the programmable bits.

Those skilled in the art will recognize that to accomplish programming and reading of the programmable bits 121, 131, $111_1$-$111_n$ and $141_1$-$141_o$, as described above, additional on-chip and/or off-chip components will be required. For example, as illustrated in FIGS. 3 and 4, a read/write circuit controller 160 can be operably connected to a read/write circuit 150 for the programmable bits 121, 131, $111_1$-$111_n$ and $141_1$-$141_o$ and can cause the read/write circuit 150 to program selected ones of the programmable bits and to read selected ones of the programmable bits. The read/write circuit controller 160 can also be in communication with one or more monitor(s) 190, which, as discussed in detail below, provide information to the read/write circuit controller 160 for determining when to cause the read/write circuit 150 to program each one of first programmable bits $111_1$-$111_n$ of the usable life depletion meter 110 as the expected usable life of the IC chip 100 is depleted. The read/write circuit controller 160, the read/write circuit 150 and the monitor(s) 190 can, for example, all be components of the IC chip 100 itself (e.g., see FIG. 3). In this case, the IC chip 100 can be a supervisory microprocessor chip (i.e., can comprise a supervisory microprocessor) (not shown) or, optionally, can be in communication with a supervisory microprocessor chip on the same PCB (as shown). Alternatively, any one or more of the read/write circuit controller 160, the read/write circuit 150 and/or the monitor(s) 190 can be off-chip components (i.e., components separate from the IC chip 100) (e.g., see FIG. 4). For example, the read/write circuit controller 160, the read/write circuit 150 and/or the monitor(s) 190 can be components of a supervisory microprocessor chip (e.g., a re-use supervisor chip) mounted on the same PCB as the IC chip 100 and operably connected to the IC chip 100. In any case, read/write circuits used to selectively program and read one-time programmable bits as well as the controllers for such circuits are well known in the art. Thus, the details thereof are omitted form this specification in order to allow the reader to focus on the salient aspects of the disclosed invention.

As mentioned above, the read/write circuit controller 160 can also be in communication with one or more monitor(s) 190 that provide information to the read/write circuit controller 160 for determining when to cause the read/write circuit 150 to program the first programmable bits $111_1$-$111_n$ of the usable life depletion meter 110 in order as the expected usable life of the IC chip 100 is depleted.

For example, the monitor(s) 190 can comprise a single monitor and, specifically, a single power-on hours (POHs) monitor 191 (also referred to herein as a POHs timer). The POHs monitor 191 can measure (i.e., can be adapted to measure, can be configured to measure, etc.) the actual number of power-on hours of the IC chip 100 (i.e., the time, in hours, that electrical power is applied to the IC chip 100). Each unit of usable life represented by each first programmable bit $111_1$-$111_n$ of the usable life depletion meter 110 can correspond to a specific number x of power-on hours (POHs). For example, each unit of usable life represented by each first programmable bit can be 1000 POHs (also referred to as 1 KPOH). For purposes of illustration, 95 first programmable bits are shown indicating that the expected usable life of the IC chip 100 is 95 KPOHs. In operation, the read/write circuit controller 160 can note (i.e., can be adapted to note, can be configured to note, can be programmed to note, etc.) when the actual power-on hours as measured by a power-on hours monitor 191 have, since either the IC chip began operation or since one of the first programmable bits was last programmed (as applicable), increased by that specific number x of POHs. Then, the read/write circuit controller 160 can automatically cause (i.e., can be adapted to automatically cause, can be configured to automatically cause, can be programmed to automatically cause, etc.) the read/write circuit 150 to program the next programmable bit in order in the usable life depletion meter 110.

Alternatively, the monitor(s) 190 can comprise multiple monitors including a POHs monitor 191 as well as a voltage monitor 192 and/or a temperature monitor 193. The POHs monitor 191 can measure (i.e., can be adapted to measure, can be configured to measure, etc.) the actual number of power-on hours of the IC chip 100 (i.e., the time, in hours, that electrical power is applied to the IC chip 100). The voltage monitor 192 can monitor (i.e., can be adapted to monitor, can be configured to monitor, etc.) the supply voltage (e.g., the actual operating voltage) used to operate the IC chip 100. For example, the voltage monitor 192 can take measurements and calculate the average operating voltage of the IC chip 100 or the effective reliability voltage. The temperature monitor 193 can monitor (i.e., can be adapted to monitor, can be configured to monitor, etc.) the actual operating temperature of the IC chip 100. For example, the temperature monitor 193 can take measurements and calculate the average operating temperature of the IC chip 100, the effective reliability temperature, etc.). In this case, each unit of usable life represented by each first programmable bit $111_1$-$111_n$ in the usable life depletion meter 110 can correspond to a specific number x of POHs (e.g., 1000 POHs or 1 KPOH, as discussed above) at a nominal operating voltage and/or a nominal operating temperature. In operation, the read/write circuit controller 160 can note (i.e., can be adapted to note, can be configured to note, can be programmed to note, etc.) when the actual power-on hours as measured by a power-on hours monitor 191 have, since either the IC chip began operation or since one of the first programmable bits was last programmed (as applicable), increased by an amount equivalent to the specific number x of POH at the nominal operating voltage and the nominal operating temperature considering any difference between the actual operating voltage as indicated by a voltage monitor 192 and the nominal operating voltage and/or considering any difference between the actual operating temperature as indicated by a temperature monitor 193 and the nominal operating temperature. Then, the read/write circuit controller 160 can automatically cause (i.e., can be adapted to automatically cause, can be configured to automatically cause, can be programmed to automatically cause, etc.) the read/write circuit 150 to program the next programmable bit in order in the usable life depletion meter 110.

More specifically, those skilled in the art will recognize that the usable life of an IC chip operating at a voltage above the nominal operating voltage and/or operating at a temperature above the nominal operating temperature will be less than the expected usable life of the IC chip at the nominal operating voltage and nominal operating temperature and vice versa. Thus, for example, a memory 165, which is accessible by the read/write circuit controller 160, can store a POHs equivalency table. This table can indicate the specific number x of POHs at the nominal operating voltage and/or the nominal operating temperature represented by each first programmable bit and can further indicate various equivalent numbers of POHs at different operating voltages and/or different operating temperatures. The read/write circuit controller 160 can access this table and, given the actual operating voltage, as indicated by the voltage monitor 192, and/or the actual operating temperature, as indicated by the temperature monitor 193, can determine the equivalent number of POHs and can automatically cause the read/write circuit 150 to program the next programmable bit in order in the usable life depletion meter 110 when the actual number of POHs has increased by that equivalent number since either the IC chip began operation or since one of the first programmable bits was last programmed (as applicable).

In any case, the programmable bits 121, 131, $111_1$-$111_n$ and $141_1$-$141_o$ can be readable by the read/write circuit 150 on demand, as controlled by the read/write circuit controller 160. Specifically, the second programmable bit 121 can be read to determine whether the IC chip 100 has been mounted on an IC chip 100. The optional third programmable bit 131 can be read to determine whether the IC chip 100 has ever failed to meet an absolute performance threshold (i.e., to determine whether the IC chip 100 should have been scrapped). The first programmable bits $111_1$-$111_n$ of the usable life depletion meter 110 can be read to determine the remaining usable life of the IC chip 100. The optional fourth programmable bits $141_1$-$141_o$ can be read to determine information, if any, about a recycler responsible for recycling the IC chip 100. As discussed in greater detail below with regard to the method embodiments, when the IC chip 100 has been previously mounted on a PCB, the fact that the IC chip 100 has or has not failed to meet the absolute performance threshold, the remaining usable life on the IC chip 100, and the information associated with a recycler responsible for recycling the IC chip 100 are all factors that can be considered when determining whether to allow re-use of the IC chip 100, when desirable or whether to prevent re-use of the IC chip 100, when undesirable. For example, re-use of the IC chip 100 may be allowed in the case of a non-critical product, when the IC chip has never failed to meet the absolute performance threshold, when the remaining usable life of the IC chip is sufficient given product-specific specifications for re-using integrated circuit chips and when the recycler responsible for recycling the IC chip is an authorized recycler given product specific specifications for re-using integrated circuit chips. However, re-use of the IC chip 100 may be prevented in the case of a critical product, when the IC chip 100 has failed to meet absolute performance threshold, when the remaining usable life of the IC chip is insufficient given product-specific specifications for re-using integrated circuit chips or when the recycler responsible for recycling the IC chip 100 is a not an authorized recycler given product-specific specifications for re-using IC chips. It should be noted that, for purposes of this disclosure, a non-critical product refers herein to a product that is not considered life or mission critical (e.g., that does not have a medical or military or other critical high reliability function such as crucial servers or crucial networks) and a critical product refers herein to a product that is considered life or mission critical (e.g., that does have a medical or military or other critical high reliability function).

Figure 5:
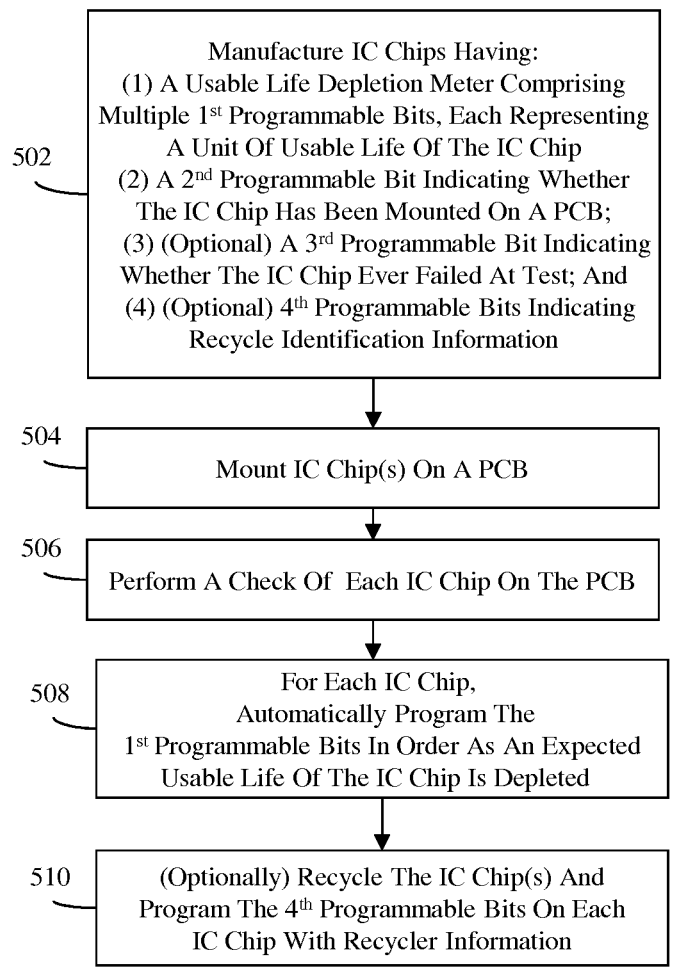
FIG. 5 is a flow diagram illustrating a method of using the usable life depletion meter of the IC chip of FIG. 1.

Referring to FIG. 5, also disclosed herein are embodiments of a method of using the above-described on-chip usable life depletion meter 110.

Specifically, the embodiments of the method can comprise manufacturing integrated circuit (IC) chips, including an IC chip 100 described in detail above and illustrated in FIG. 1 (502). Each IC chip 100 can comprise a substrate 101 and a usable life depletion meter 110 on the substrate 101. The usable life depletion meter 110 can comprise multiple first programmable bits $111_1$-$111_n$ (also referred to herein as usable life bits). These first programmable bits $111_1$-$111_n$ can represent units of usable life of the IC chip 100, which are sequentially ordered from an initial programmable bit $111_1$ that corresponds to the beginning of the usable life of the IC chip to a last programmable bit $111_n$ that corresponds to the end of the usable life of the IC chip. The integrated circuit chip 100 can further comprise a second programmable bit 121 (also referred to herein as "a printed circuit board (PCB) mounted bit") on the substrate 101. Optionally, the IC chip 100 can further comprise a third programmable bit 131 (also referred to herein as a "do not use bit") and multiple fourth programmable bits $141_1$-$141_n$ (also referred to herein as "recycler identifier bits") on the substrate 101. All of the above-described programmable bits (i.e., the first programmable bits $111_1$-$111_n$, the second programmable bit 121, the third programmable bit 131 and the fourth programmable bits $141_1$-$141_o$) can specifically comprise one-time programmable bits (e.g., fuses, anti-fuses or any other suitable one-time programmable bits).

The embodiments of the method can further comprise mounting IC chips, including the IC chip 100, on a printed circuit board (PCB) for incorporation into a product (504). The product can, for example, be any end product. For purposes of this disclosure, an end product can be any product that comprises a PCB with IC chip(s) mounted thereon. Such end products can, for example, range from toys and other low-end applications to advanced computer products having a display, a keyboard or other input device, a central processing unit (CPU), etc. It should be noted that, for purposes of this disclosure, a non-critical product refers herein to a product that is not considered life or mission critical (e.g., that does not have a medical or military or other critical high reliability function such as crucial servers or crucial networks) and a critical product refers herein to a product that is considered life or mission critical (e.g., that does have a medical or military or other critical high reliability function).

The embodiments of the method can further comprise performing a check of each IC chip 100 on the PCB (506).

Figure 6:
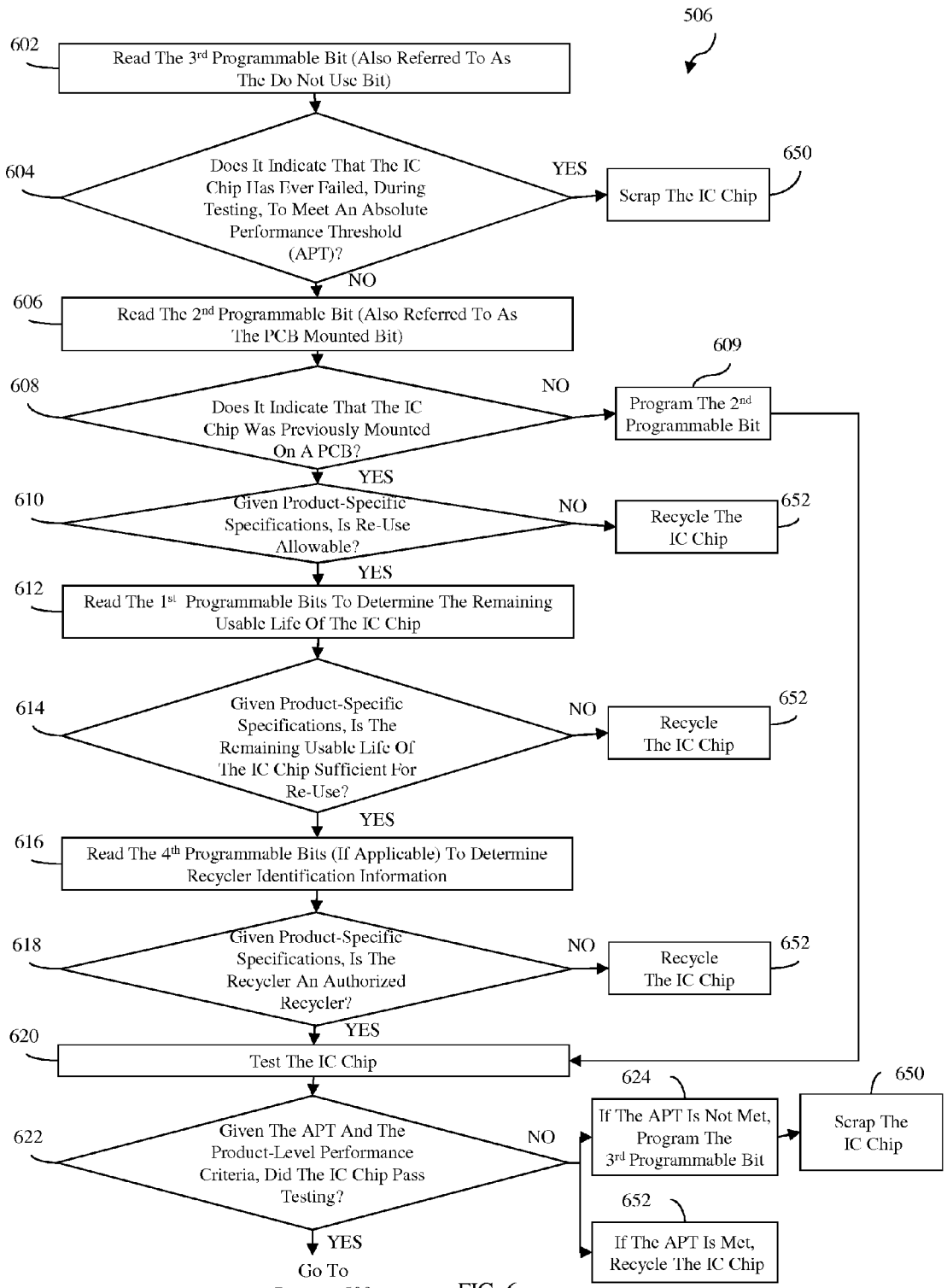
FIG. 6 is a flow diagram further illustrating the 506 of FIG. 5.

Referring to the flow diagram of FIG. 6, for the IC chip 100, this check process 506 can comprise reading a third programmable bit 131 (i.e., a do not use bit), if present on the IC chip 100, and determining whether that third programmable bit 131 remains unprogrammed (e.g., as shown in FIGS. 2A and 2B), which indicates that the IC chip 100 has never been tested or has always met, during testing, an absolute performance threshold for use or whether the third programmable bit 131 has been programmed (e.g., as shown in FIG. 2C), which indicates that the IC chip 100 previously failed, during testing, to meet an absolute performance threshold for use (602)-(604). It should also be understood that the absolute performance threshold for use can apply to all IC chips having a specific design. This absolute performance threshold can further be established in order to scrap any IC chips that were manufactured according to the specific design, but due, for example, to defects or process variation perform at a level that would be considered unsuitable for use in essentially all applications (e.g., 95% of applications, 99% of applications, etc.). This absolute performance threshold for use can further be established in order to allow for possible use of any IC chips that were manufactured according to the specific design and that perform at a level suitable for use in some or all applications.

When it is determined at process 604 that the third programmable bit 131 has been programmed (i.e., that the IC chip 100 has, at some point, failed to meet an absolute performance threshold for use), the IC chip 100 can be scrapped (650).

When it is determined at process 604 that the third programmable bit 131 has not been programmed (i.e., that the IC chip 100 has, to date, never failed to meet the absolute performance threshold for use) or when there is no third programmable bit 131 present, the check process 506 can comprise reading the second programmable bit 121 (i.e., the PCB mounted bit) and determining whether the second programmable bit 121 is unprogrammed (e.g., as shown in FIG. 2A), which indicates that the IC chip 100 has not been previously mounted on a different PCB (i.e., has not been recycled), or whether the second programmable bit 121 has been programmed, which indicates that the IC chip 100 has been previously mounted on a different PCB (i.e., has been recycled) (606)-(608). When it is determined at process 608 that the second programmable bit 121 has not been previously programmed (i.e., that the IC chip 100 has not been recycled), that second programmable bit 121 can be programmed (609).

When it is determined that the second programmable bit 121 has been previously programmed (i.e., that the IC chip 100 has been recycled), a determination can be made as to whether or not re-use of the IC chip 100 within the product is allowable, as indicated by product-specific specifications for re-using IC chips (610). Such product-specific specifications can, for example, be stored in memory. This memory can be on the IC chip 100 itself (e.g., in the case where the IC chip 100 is a supervisory microprocessor chip) (not shown). Alternatively, this memory can be on a discrete supervisory microprocessor chip (also referred to as a re-use supervisor chip) that is in communication with each IC chip 100 on the PCB. The product-specific specifications can comprise rules for re-use of IC chips within the product that contains the PCB (i.e., for incorporating recycled IC chips into the product). These rules can be customer-specified or based on applicable laws, regulations, safety guidelines, etc., associated with the product at issue. For example, the product-specific specifications can indicate that the product into which the IC chip 100 is to be incorporated is a life or mission critical product such that no IC chip re-use is allowed. In this case, the IC chip 100 can be recycled (652). That is, it can be removed from the PCB and re-binned, for example, for possible use in a different product that is not life or mission critical. Alternatively, the product-specific specifications can indicate that the product into which the IC chip 100 is to be incorporated is not a life or mission critical product such that IC chip re-use is allowable.

If at process 610 it is determined that IC chip re-use is allowable, additional factors can be considered before determining whether or not to in fact allow re-use of the IC chip 100 within the product. Specifically, the first programmable bits $111_1$-$111_n$ (i.e., the usable life bits) of the usable life depletion meter 110 on the IC chip 100 can be read to determine the remaining usable life of the IC chip 100 and a determination can be made as to whether or not the remaining usable life of the IC chip 100 is sufficient for re-use, as indicated by the product-specific specifications for re-using IC chips (612)-(614). For example, consider the exemplary usable life depletion meter 110 shown in FIG. 2F, which has approximately 60 percent of usable life remaining. If the product-specific specifications require a remaining usable life of 90% or more for re-use, then an IC chip 100 comprising this meter 110 would not have a sufficient amount of usable life remaining for re-use. When it is determined at process 614 that there is an insufficient amount of usable life remaining for re-use, the IC chip 100 can be recycled (652). That is, it can be removed from the PCB and re-binned, for example, for possible use in a different product that requires a lesser amount of remaining usable life. However, if the product-specific specifications require a remaining usable life of 50% or more, then an IC chip 100 comprising this meter 110 would have sufficient amount of usable life remaining for re-use. When it is determined at process 614 that the IC chip 100 has a sufficient amount of usable life remaining for re-use, fourth programmable bits $141_1$-$141_n$ (i.e., recycler identifier bits), if present on the IC chip 100, can be read in order to obtain identification information about the recycler responsible for recycling the IC chip 100 (i.e., responsible for removing the IC chip from a different PCB) and to further determine whether or not the recycler was an authorized recycler, as indicated by the product-specific specifications for re-use of IC chips (616)-(618). For example, recycler identification information can include, but is not limited to, an organization name, an organization identification number, a certification number and/or any other suitable identification information. The product-specific specifications for re-use of IC chips can, in addition to the rules described above, list authorized recyclers by name, identification number, certification number, or any other suitable identification information. When it is determined that the recycler is not an authorized recycler, the IC chip 100 can be recycled (652). That is, it can be removed from the PCB and re-binned, for example, for possible use in a different product for which the recycler is an authorized recycler.

Finally, when it is determined at process 608 that the IC chip 100 has never been mounted on a different PCB (i.e., when it is determined that the IC chip 100 has not been recycled) or when it is determined at process (610)-(618) that IC chip re-use is allowable, that the IC chip 100 has a sufficient amount of usable life remaining for such re-use, and that the recycler responsible for recycling the IC chip 100 was an authorized recycler, then the IC chip 100 can be tested (e.g., along with other IC chips mounted on the PCB) and a determination can be made as to whether or not the IC chip 100 currently meets the absolute performance threshold for use as well as product-level performance criteria (620)-(622). If the IC chip 100 fails to meet the absolute performance threshold for use (whether or not it fails to meet the product-level performance criteria), a third programmable bit 131 (i.e., a do not use bit), if present on the IC chip 100, can be programmed (624) and the IC chip 100 can be scrapped (650). If the IC chip 100 meets the absolute performance threshold for use, but does not meet the product-level performance criteria, it can be recycled (i.e., removed and re-binned for possible re-use) (652). However, if the IC chip 100 passes testing (i.e., meets both the absolute performance threshold for use and the product-level performance criteria), operation of the IC chip 100 on the PCB within the product can proceed at process 508 of FIG. 5.

Referring again to FIG. 5, the embodiments of the method can further comprise, during operation of the IC chip 100 on a PCB within a product, automatically programming the first programmable bits $111_1$-$111_n$ of the usable life depletion meter 110 one at a time in order, as the expected usable life of the IC chip 100 is depleted. During operation of the IC chip 100, the first programmable bits can be automatically programmed in order over the course of the usable life of the IC chip 100. This programming process can start with the initial programmable bit $111_1$ (see FIG. 2D) at the beginning of the usable life of the IC chip and can end with the last programmable bit $111_n$ when the expected usable life of the IC chip 100 is fully depleted (i.e., when the expected usable life if the IC chip 100 has passed) (see FIG. 2E) unless recycling occurs prior to that time. For purposes of this disclosure, the expected usable life of the IC chip 100 (also referred to in the art as the expected useful life of the IC chip 100) refers to the expected minimum amount of time or, more particularly, the expected minimum number of power-on hours (POHs) during which the IC chip is expected, with a specified probability, to perform without fail.

More specifically, in one embodiment of the method, each unit of usable life represented by each first programmable bit $111_1$-$111_n$ in the usable life depletion meter 110 can correspond to a specific number x of power-on hours (POHs) (e.g., 1000 POHs, also referred to as 1 KPOH). In this case, the process 508 of programming the first programmable bits $111_1$-$111_n$ can comprise: noting whenever the actual power-on hours as measured by a power-on hours monitor have increased by that specific number x of POHs; and, in response, programming the next programmable bit in order in the usable life depletion meter 110.

In another embodiment of the method, each unit of usable life represented by each first programmable bit $111_1$-$111_n$ in the usable life depletion meter 110 can correspond to a specific number x of power-on hours (POHs) at a nominal operating voltage and/or a nominal operating temperature. In this case, the process 508 of programming the first programmable bits $111_1$-$111_n$ can comprise: noting whenever the actual power-on hours as measured by a power-on hours monitor have increased by an amount equivalent to the specific number x of POHs at the nominal operating voltage and the nominal operating temperature considering any difference between the actual operating voltage as indicated by a voltage monitor and the nominal operating voltage and/or considering any difference between the actual operating temperature as indicated by a temperature monitor and the nominal operating temperature; and, in response, programming the next programmable bit in order in the usable life depletion meter 110.

Optionally, the embodiments of the method can further comprise recycling the IC chips on the PCB (510). During recycling, each IC chip, including the IC chip 100, can be removed from the PCB by a recycler, reconditioned, marked and binned for possible re-use. In this case, if fourth programmable bits $141_1$-$141_o$ (i.e., recycler information bits) are present on the IC chip 100, then the recycler that performed the recycling can also program those bits $141_1$-$141_o$ with recycler information. This recycler information can subsequently be used during a check process 506, which is performed after the IC chip 100 is selected for re-use and mounted on another PCB for incorporation into a new product at process 504. Specifically, when a recycled IC chip is selected for re-use and mounted on another PCB, the check process 506 can be performed as discussed in detail above and illustrated in the flow diagram of FIG. 6. During this check process, the recycler information can be read from the fourth programmable bits $141_1$-$141_o$ and used to determine whether the recycler responsible for the recycling the IC chip 100 is an authorized recycler and, thereby to determine whether re-use of the IC chip 100 in the new product is allowed (e.g., see processes 616-618 of FIG. 6).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of an integrated circuit (IC) chip having an on-chip usable life depletion meter. This usable life depletion meter can comprise multiple programmable bits, which represent units of usable life. These programmable bits can be sequentially ordered from an initial programmable bit to a last programmable bit and can be automatically programmed in order, as the expected usable life of the IC chip is depleted. These programmable bits can be readable to determine the remaining usable life of the IC chip. Also disclosed above are embodiments of a method that uses such an on-chip usable life depletion meter. In embodiments of the method, the remaining usable life of an IC chip, once known, can be used either as the basis for allowing re-use of the IC chip, when desirable (e.g., in the case of a non-critical application and when the remaining usable life is sufficient), or as the basis for preventing re-use of the IC chip, when undesirable (e.g., in the case of a critical application or when the remaining usable life is insufficient).

What is claimed is:

1. An integrated circuit chip comprising:
   a substrate;
   a usable life depletion meter on said substrate,
      said usable life depletion meter comprising multiple first programmable bits,
      said first programmable bits representing units of usable life of said integrated circuit chip,
      said first programmable bits being sequentially ordered from an initial programmable bit to a last programmable bit,
      said first programmable bits being automatically programmed, during operation of said integrated circuit chip, in order starting with said initial programmable bit as an expected usable life of said integrated circuit chip is depleted,
      said first programmable bits being readable to determine a remaining usable life of said integrated circuit chip, and
      each unit of usable life represented by each first programmable bit corresponding to a specific number of power-on hours;
   a power-on hours monitor measuring actual power-on hours of said integrated circuit chip;
   a read/write circuit; and
   a read/write circuit controller in communication with said power-on hours monitor and said read/write circuit,
      said read/write circuit controller noting whenever said actual power-on hours have increased by said specific number of power-on hours and, in response, automatically causing said read/write circuit to program a next programmable bit in said usable life depletion meter.

2. The integrated circuit chip of claim 1, said first programmable bits comprising any of fuses and anti-fuses.

3. The integrated circuit chip of claim 1, further comprising a second programmable bit being either programmed to indicate, when read, that said integrated circuit chip has been mounted on a printed circuit board or unprogrammed to indicate, when read, that said integrated circuit chip has never been mounted on any printed circuit board.

4. The integrated circuit chip of claim 1, further comprising a third programmable bit being either programmed to indicate, when read, that said integrated circuit chip failed to meet an absolute performance threshold for use or unprogrammed to indicate, when read, that said integrated circuit chip has not failed to meet said absolute performance threshold for use.

5. The integrated circuit chip of claim 1, further comprising fourth programmable bits being either programmed to indicate, when read, identification information associated with a recycler responsible for recycling said integrated circuit chip or unprogrammed.

6. An integrated circuit chip comprising:
   a substrate;
   a usable life depletion meter on said substrate, said usable life depletion meter comprising multiple first programmable bits, said first programmable bits representing units of usable life of said integrated circuit chip, each unit of usable life represented by each first programmable bit corresponding to a specific number of power-on hours at a nominal operating voltage and a nominal operating temperature, said first programmable bits being sequentially ordered from an initial programmable bit to a last programmable bit, said first programmable bit being automatically programmed, during operation of said integrated circuit chip, in order starting with said initial programmable bit as an expected usable life of said integrated circuit chip is depleted, and said first programmable bits being readable to determine a remaining usable life of said integrated circuit chip;

a power-on hours monitor measuring actual power-on hours of said integrated circuit chip;

a voltage monitor monitoring actual operating voltage of said integrated circuit chip;

a temperature monitor monitoring actual operating temperature of said integrated circuit chip;

a read/write circuit; and a read/write circuit controller in communication with said power-on hours monitor, said voltage monitor, said temperature monitor and said read/write circuit, said read/write circuit controller noting whenever, given any differences between said actual operating voltage and said nominal operating voltage and between said actual operating temperature and said nominal operating temperature, said actual power-on hours have increased by an amount equivalent to said specific number of power-on hours at said nominal operating voltage and said nominal operating temperature and, in response, automatically causing said read/write circuit to program a next programmable bit in said usable life depletion meter.

7. The integrated circuit chip of claim 6, said first programmable bits comprising any of fuses and anti-fuses.

8. The integrated circuit chip of claim 7, further comprising a second programmable bit being either programmed to indicate, when read, that said integrated circuit chip has been mounted on a printed circuit board or unprogrammed to indicate, when read, that said integrated circuit chip has never been mounted on any printed circuit board.

9. The integrated circuit chip of claim 7, further comprising a third programmable bit being either programmed to indicate, when read, that said integrated circuit chip failed to meet an absolute performance threshold for use or unprogrammed to indicate, when read, that said integrated circuit chip has not failed to meet said absolute performance threshold for use.

10. The integrated circuit chip of claim 7, further comprising fourth programmable bits being either programmed to indicate, when read, identification information associated with a recycler responsible for recycling said integrated circuit chip or unprogrammed.

11. A method comprising:

mounting an integrated circuit chip onto a printed circuit board, said integrated circuit chip comprising: a substrate and a usable life depletion meter on said substrate, said usable life depletion meter comprising multiple first programmable bits, said first programmable bits representing units of usable life of said integrated circuit chip and being sequentially ordered from an initial programmable bit to a last programmable bit; and, during operation of said integrated circuit chip, automatically programming said first programmable bits in order starting with said initial programmable bit as an expected usable life of said integrated circuit chip is depleted, said integrated circuit chip further comprising a second programmable bit and said method further comprising, after said mounting of said integrated circuit chip on said printed circuit board, performing the following:

reading said second programmable bit to determine whether said integrated circuit chip was previously mounted on a different printed circuit board;

when said integrated circuit chip was previously mounted on said different printed circuit board, determining whether re-use of said integrated circuit chip on said printed circuit board is allowable based on specifications for re-using integrated circuit chips; and, when said re-use of said integrated circuit chip is allowable, reading said first programmable bits to determine a remaining usable life of said integrated circuit chip and only allowing said re-use when said remaining usable life is sufficient based on said specifications.

12. The method of claim 11, said first programmable bits comprising any of fuses and anti-fuses.

13. The method of claim 11, said integrated circuit chip comprising a third programmable bit and said method further comprising, after said mounting of said integrated circuit chip on said printed circuit board, performing the following:

reading said third programmable bit to determine whether said integrated circuit chip has failed to meet an absolute performance threshold for use; and, when said integrated circuit chip has failed to meet said absolute performance threshold for use, scrapping said integrated circuit chip.

14. The method of claim 11, said integrated circuit chip further comprising fourth programmable bits and said method further comprising, when said integrated circuit chip was previously mounted on said different printed circuit board, further performing the following:

reading said fourth programmable bits to identify a recycler responsible for recycling said integrated circuit chip; and, determining whether said recycler is an authorized recycler based on said specifications.

15. The method of claim 11, each unit of usable life represented by each first programmable bit corresponding to a specific number of power-on hours, said method further comprising measuring actual power-on hours of said integrated circuit chip, and said programming of said first programmable bits in said order comprising:

noting whenever said actual power-on hours have increased by said specific number of power-on hours; and, in response, programming a next programmable bit in said usable life depletion meter.

16. The method of claim 11, each unit of usable life represented by each first programmable bit corresponding to a specific number of power-on hours at a nominal operating voltage and a nominal operating temperature, said method further comprising:
  measuring actual power-on hours of said integrated circuit chip;
  monitoring actual operating voltage of said integrated circuit chip; and,
  monitoring actual operating temperature of said integrated circuit chip, and said programming of said first programmable bits in said order comprising:
  noting whenever, given any differences between said actual operating voltage and said nominal operating voltage and between said actual operating temperature and said nominal operating temperature, said actual power-on hours have increased by an amount equivalent to said specific number of power-on hours at said nominal operating voltage and said nominal operating temperature, and
  in response, programming a next programmable bit in said usable life depletion meter.

* * * * *